United States Patent [19]

Satokawa et al.

[11] Patent Number: 4,656,108

[45] Date of Patent: Apr. 7, 1987

[54] PATTERNED FILM OF THIOCARBONYL FLUORIDE POLYMER

[75] Inventors: Takaomi Satokawa, Takatsuki; Tsuneo Fujii, Suita; Takayuki Deguchi, Ibaraki, all of Japan

[73] Assignee: Daikin Kogyo Co., Ltd., Osaka, Japan

[21] Appl. No.: 746,932

[22] Filed: Jun. 20, 1985

Related U.S. Application Data

[60] Division of Ser. No. 551,514, Nov. 15, 1983, abandoned, which is a continuation-in-part of Ser. No. 392,079, Jun. 25, 1982, abandoned.

[30] Foreign Application Priority Data

Jun. 30, 1981 [JP] Japan .................................. 56-102726

[51] Int. Cl.$^4$ .............................................. G03C 3/00
[52] U.S. Cl. ..................................... 430/18; 430/270; 430/326; 430/313; 430/296; 428/195

[58] Field of Search ............... 430/270, 296, 313, 390, 430/326, 18; 204/159.14, 159.22; 428/195

[56] References Cited

U.S. PATENT DOCUMENTS

| | | | |
|---|---|---|---|
| 2,980,695 | 4/1961 | Middleton | 528/387 |
| 3,240,765 | 3/1966 | Middleton | 528/390 |
| 4,125,671 | 11/1978 | Kakuchi et al. | 428/421 |
| 4,125,672 | 11/1978 | Kakuchi et al. | 428/421 |

*Primary Examiner*—Jack P. Brammer
*Attorney, Agent, or Firm*—Armstrong, Nikaido, Marmelstein & Kubovcik

[57] ABSTRACT

A resist film made of thiocarbonyl fluoride polymers which has excellent sensitivity, resolving power and adhesion property to a substrate and can provide a fine resist pattern. The resist pattern is produced by forming the resist film on a substrate, irradiating an ionizing radiation and developing with an organic solvent.

4 Claims, 2 Drawing Figures

PATTERNED FILM OF THIOCARBONYL FLUORIDE POLYMER

This application is a division of application Ser. No. 551,514 filed Nov. 15, 1983, now abandoned, which is a Rule 62 continuation-in-part application of grandparent Ser. No. 392,079, filed June 25, 1982, now abandoned.

BACKGROUND OF THE INVENTION

The present invention relates to a resist and a process for forming a resist pattern. More particularly, the invention relates to a poly(thiocarbonyl fluoride) resist which is sensitive to an ionizing radiation and a process for forming a resist pattern by forming the resist film on a substrate, irradiating the film with an ionizing radiation and developing with an organic solvent.

Various resist materials have been employed in the preparation of semiconductor integrated circuits, and for development of the integrated circuits, a study for making a circuit pattern finer becomes a great subject of the day. Particularly, in integrated circuits having high integration such as very large scale integrated circuits, it is necessary to form a fine pattern less than 1 μm in width, and vigorous efforts to develop resist materials have been made for the purpose.

Polymethyl methacrylate is put to practical use as a positive type resist. The sensitivity of this resist is about $1\times10^{-4}$ coulomb/cm$^2$ and the $\gamma$ value showing resolution is about 3.3. A poly(fluoroalkyl methacrylate) is also known as a resist material having excellent sensitivity and $\gamma$ value from Japanese Patent Publication No. 24088/1980, and some poly(fluoroalkyl methacrylate) has a sensitivity of $4\times10^{-7}$ coulomb/cm$^2$. Also, the $\gamma$ value of the poly(fluoroalkyl methacrylate) is within a range of from about 4.5 to about 10. The polymers of this kind have the defect, and it is reported in Japanese Patent Publication No. 30613/1980 that the polymers are poor in adhesion property to substrates such as silicon dioxide, silicon and silicon nitride and a developer often soaks into the interface between the resist film and the substrate during the development to cause the resist film to peel off.

It is an object of the present invention to provide a resist having excellent resolution, sensitivity and adhesion properties.

A further object of the invention is to provide a resist capable of forming a fine resist pattern.

Another object of the invention is to provide a process for forming a fine resist pattern.

These and other objects of the present invention will become apparent from the description hereinafter.

SUMMARY OF THE INVENTION

It has been found that poly(thiocarbonyl fluoride) which has entirely different structure and properties from methacrylate polymers conventionally known as positive type resists, has a sensitivity and resolving power to an ionizing radiation which are comparable to those of the above-mentioned poly(fluoroalkyl methacrylate), and moreover it can provide a positive type resist having an excellent adhesion property to a substrate.

In accordance with the present invention, there is provided a resist consisting essentially of a resist film of a thiocarbonyl fluoride polymer having a thickness of 0.1 to 5 μm on a substrate, said a positive acting thiocarbonyl fluoride polymer having a molecular weight of 5,000 to 500,000 and being selected from the group consisting of poly(thiocarbonyl fluoride), copolymers of thiocarbonyl fluoride with ethylenically unsaturated compounds, and the thiocarbonyl fluoride homo- and co-polymers partially modified with elemental fluorine.

The present invention also provides a process for forming a resist pattern which comprises the steps of forming a resist film of a thiocarbonyl fluoride polymer on a substrate, irradiating the resist film with an ionizing radiation and developing it with an organic solvent.

DETAILED DESCRIPTION

Figure 1:
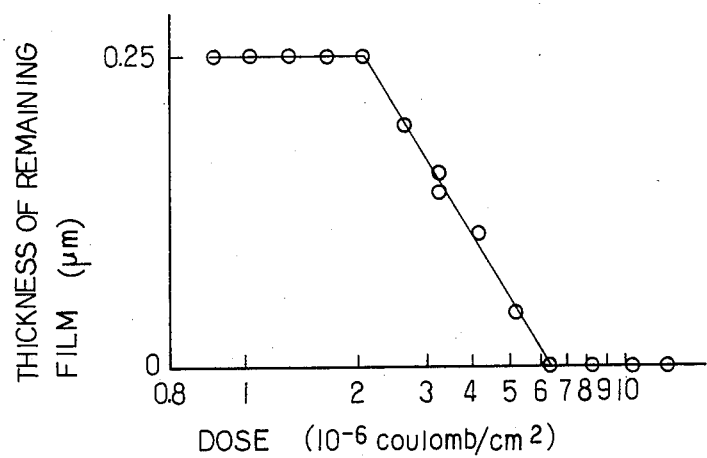
FIG. 1 is a graph showing the relationship between dose and thickness of remaining resist film in irradiation with electron beams of the resist film of the present invention.

Poly(thiocarbonyl fluoride) used in the present invention is a known polymer consisting of recurring units of the formula (I):

and the polymer having a molecular weight of 5,000 to 500,000 is preferred. In the present invention, there can also be used copolymers of thiocarbonyl fluoride and other ethylenically unsaturated compounds of addition-polymerizable with thiocarbonyl fluoride. The content of the ethylenically unsaturated compound is at most 25%, by weight, preferably at most 10% by weight. Examples of the ethylenically unsaturated compounds are tetrafluoroethylene, vinyl fluoride, vinylidene fluoride, hexafluoropropene, trifluoroethylene, chlorotrifluoroethylene, propene and allyl chloroformate. Further, the above thiocarbonyl fluoride homopolymer and copolymers may be partially modified by treating with elemental fluorine, for instance, in a manner as disclosed in Belgian Pat. No. 649,765, and such partially flourinated polymers can also be employed in the present invention.

Poly(thiocarbonyl fluoride) is prepared by polymerizing thiocarbonyl fluoride of the formula (II):

as disclosed in detail in a report of W. J. Middleton et al, J. Polymer Sci., Part A, Vol. 3, 4115(1965). The raw material, thiocarbonyl fluoride, can be prepared by the reaction of tetrafluoroethylene ($F_2C=CF_2$) and sulfur, as disclosed in Japanese Patent Publication No. 37000/1977.

The above-mentioned thiocarbonyl fluoride polymer is soluble in organic solvents such as chloroform, carbon tetrachloride, 1,1,2-trifluoro-1,2,2-trichloroethane, methyl ethyl ketone and methyl isobutyl ketone. A resist film can be formed on a substrate from a solution of the polymer in these solvents. For instance, a resist film of a thiocarbonyl fluoride polymer of the present invention is formed by dissolving the polymer in an organic solvent such as chloroform, carbon tetrachloride or 1,1,2-trifluorotrichloroethane to give a solution, coating the solution on a substrate, for instance, with a spin coater, and evaporating the solvent by heating or air-drying. The thickness of the resist film is usually selected from 0.1 to 5 $\mu$m.

The substrates to be used in the present invention are not particularly limited, and various kinds of substrates can be used, e.g. a glass plate masked with chromium, and a semiconductor film such as silicon, silicon dioxide or silicon nitride. The substrates are suitably selected according to the purposes of the resist.

The resist film of the invention can be delineated with an ionizing radiation such as electron beams, X-rays or deep ultraviolet rays. A resist pattern is formed by irradiating the resist film with an ionizing radiation according to a predetermined pattern, and developing it with an organic solvent. The resist film of the invention has a high sensitivity on the order of $10^{-6}$ coulomb/cm$^2$ and an excellent resolution of $\gamma$ value from 1.0 to 3.3, and is a useful high sensitive resist of positive type comparable to a poly(fluoroalkyl methacrylate) resist.

Organic solvents used for development are not particularly limited, and for instance, mixtures of a good solvent such as chloroform, carbon tetrachloride, 1,1,2-trifluoro-1,2,2-trichloroethane, methyl ethyl ketone or methyl isobutyl ketone and a poor solvent such as a lower alcohol are usable. In case of the electron beam irradiation, a mixed solvent of methyl ethyl ketone and ethanol, especially in a ratio of 50:50 to 99:1 by volume, is preferably used as a developer. Also, in case of the deep ultraviolet ray irradiation, a mixed solvent of methyl isobutyl ketone and isopropanol, especially in a ratio of 99:1 to 10:90 by volume, is preferably employed as a developer.

The development time is suitably determined according to conditions such as degree of polymerization of the polymer, kind of the ionizing radiation to be irradiated, kind of a developer, mixing ratio of organic solvents and developing temperature. For instance, it is selected from 10 seconds to 30 minutes.

The present invention is more specifically described and explained by means of the following Examples.

It is to be understood that the present invention is not limited to the Examples and various changes and modifications may be made in the invention without departing from the spirit and scope thereof.

EXAMPLE 1

A 8% by weight solution of poly(thiocarbonyl fluoride) having a number average molecular weight of 350,000 was prepared by dissolving the polymer in chloroform, and was coated onto a silicon substrate by a spin coater over 60 seconds. The solvent was then evaporated by heating the coated substrate at 140° C. for 30 minutes to form a resist film having a thickness of 0.25 $\mu$m.

The electron beam delineation of the resist film was carried out by employing E-302 type electron beam delineation apparatus made by Kabushiki Kaisha Elionix, Japan. Electron beams (current: $1 \times 10^{-9}$ A, acceleration voltage: 20 kV) were irradiated to different portions $4.3 \times 10^{-4}$ cm$^2$ of the resist film for 0.08 second ($1.87 \times 10^{-7}$ coulomb/cm$^2$) to 125 seconds ($2.88 \times 10^{-4}$ coulomb/cm$^2$) to form a 32 $\mu$m line and space pattern.

The irradiated resist film was then immersed in a mixed solvent of methyl ethyl ketone and ethanol in a volume ratio of 90:10 for 90 seconds to develop the resist pattern, and washed by immersing in isopropanol for 60 seconds.

After drying the resist pattern, the thickness was measured by employing a Talystep (Rank Taylor Hobson, England).

The relationship between the dose of electron beams (coulomb/cm$^2$) and the thickness of the remaining film ($\mu$m) is shown in FIG. 1. It is found from FIG. 1 that the sensitivity and $\gamma$ value of the resist are $6.3 \times 10^{-6}$ coulomb/cm$^2$ and 2.0, respectively.

Also, in the patterning, no soaking of the developer into the interface between the resist film and the substrate was observed, and it was confirmed that the resist film had excellent adhesion property to a substrate.

EXAMPLE 2

The procedure of Example 1 was repeated except that a mixed solvent of methyl ethyl ketone and ethanol in a volume ratio of 95:5 was employed as a developer instead of the mixed solvent of methyl ethyl ketone and ethanol in a volume ratio of 90:10.

The sensitivity was $3.70 \times 10^{-6}$ coulomb/cm$^2$ and the $\gamma$ value was 3.3.

Also, in the patterning, no soaking of the developer was observed and the resist film had an excellent adhesion property to a substrate.

EXAMPLE 3

A resist film was formed on a silicon substrate in the same manner as in Example 1, and exposed to deep ultraviolet rays (wavelength: not less than 180 nm) from a deuterium hydrogen lamp (400 W, 1.5 A) 5 cm distant from the resist film for varied period of irradiation time (at 1 minute intervals from 1 to 8 minutes).

After the irradiation, the irradiated resist film was immersed in a mixed solvent of methyl isobutyl ketone and isopropanol (60:40 by volume) at 23° C. for 90 seconds for devolopment, immersed in isopropanol for 60 seconds to wash and then dried.

Figure 2:
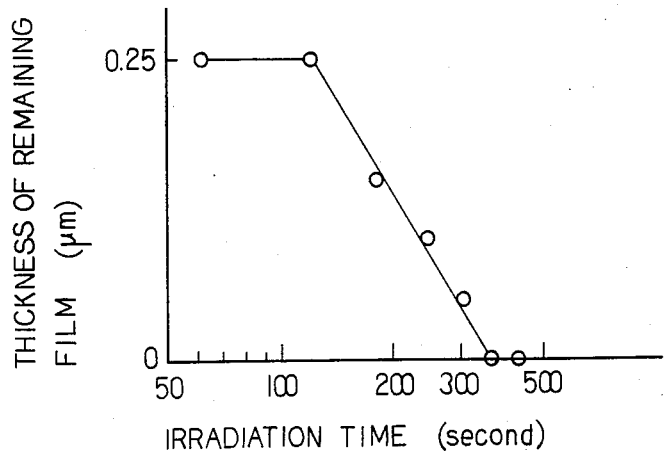
FIG. 2 is a graph showing the relationship between irradiation time and thickness of remaining resist film in irradiation with deep ultraviolet rays of the resist film of the present invention.

The relationship between the thickness of the remaining film and the irradiation time is shown in FIG. 2. It is found from FIG. 2 that the sensitivity and $\gamma$ value of the resist film are 0.060 J/cm$^2$ and 2.0, respectively.

Also, in the patterning, no soaking of the developer was observed, thus the resist film had an excellent adhesion property to the substrate.

In addition to the ingredients used in the Examples, other ingredients can be used in the Examples as set forth in the specification to obtain substantially the same results.

What we claim is:

1. A resist pattern consisting essentially of a patterned film of a thiocarbonyl fluoride polymer having a thickness of 0.1 to 5 $\mu$m provided on a substrate, said thiocarbonyl fluoride polymer comprising recurring units of the formula (I)

and being selected from the group consisting of poly(thiocarbonyl fluoride) and copolymers of thiocarbonyl fluoride with ethylenically unsaturated compounds, said thiocarbonyl fluoride polymer having a molecular weight of 5,000 to 500,000, and said patterned film being prepared by forming a film of said thiocarbonyl fluoride polymer on the substrate, irradiating the film in a pattern with ionizing radiation and developing the irradiated film with an organic solvent.

2. The resist pattern of claim 1, wherein the substrate is a silicon substrate.

3. A resist pattern consisting essentially of an irradiated and developed film of a positive acting resist having a thickness of 0.1 to 5 μm provided on a substrate, said positive acting resist being a thiocarbonyl fluoride polymer comprising recurring units of the formula (I)

and being selected from the group consisting of poly(thiocarbonyl fluoride) and copolymer of thiocarbonyl fluoride with ethylenically unsaturated compounds, the molecular weight of said thiocarbonyl polymer being 5,000 to 500,000.

4. The resist pattern of claim 3, wherein the substrate is a silicon substrate.

* * * * *